US006759867B2

(12) United States Patent
Sohn

(10) Patent No.: US 6,759,867 B2
(45) Date of Patent: Jul. 6, 2004

(54) INSPECTION APPARATUS FOR LIQUID CRYSTAL DISPLAY DEVICE

(75) Inventor: Seong Woo Sohn, Daegu-shi (KR)

(73) Assignee: L. G. Philips LCD., Ltd., Seoul (KR)

( * ) Notice: Subject to any disclaimer, the term of this patent is extended or adjusted under 35 U.S.C. 154(b) by 290 days.

(21) Appl. No.: 09/893,995

(22) Filed: Jun. 29, 2001

(65) Prior Publication Data

US 2002/0085198 A1 Jul. 4, 2002

(30) Foreign Application Priority Data

Dec. 30, 2000 (KR) ..................................... P 2000-86921

(51) Int. Cl.[7] ......................... G01R 31/00; G01R 31/02

(52) U.S. Cl. ........................ 324/770; 324/755; 345/904

(58) Field of Search ................................ 324/770, 755, 324/754, 158.1, 758, 757, 761, 753, 73.1; 349/149, 58, 192; 345/87, 904, 905

(56) References Cited

U.S. PATENT DOCUMENTS

| | | | | |
|---|---|---|---|---|
| 4,823,078 A | * | 4/1989 | Mohebban | 324/133 |
| 5,285,150 A | * | 2/1994 | Henley et al. | 324/770 |
| 5,546,013 A | * | 8/1996 | Ichioka et al. | 324/770 |
| 5,999,012 A | * | 12/1999 | Listwan | 324/770 |
| 6,137,300 A | * | 10/2000 | Hayashida | 324/758 |
| 6,396,299 B1 | * | 5/2002 | Hayashida | 324/770 |
| 6,587,160 B2 | * | 7/2003 | Lee et al. | 349/40 |

* cited by examiner

*Primary Examiner*—Anjan K. Deb

(74) *Attorney, Agent, or Firm*—Morgan Lewis & Bockius LLP

(57) ABSTRACT

A probe frame assembly of an inspection apparatus for a liquid crystal display is capable of inspecting more than six LCD panels patterned on a glass substrate. In the assembly, at least two probe frame bodies are provided above the upper surface of a chuck such that they can accommodate a range of numbers of liquid crystal display panels, and simultaneously apply test pattern signals to shorting bars provided on one or more liquid crystal display panels.

19 Claims, 11 Drawing Sheets

INSPECTION APPARATUS FOR LIQUID CRYSTAL DISPLAY DEVICE

This application claims the benefit of Korean Application No. P2000-86921 filed on Dec. 30, 2000, which is hereby incorporated by reference.

BACKGROUND OF THE INVENTION

1. Field of the Invention

This invention relates to a liquid crystal display, and more particularly to an inspection apparatus for a liquid crystal display that is capable of inspecting more than six panels patterned on a single substrate of glass.

2. Description of the Related Art

Generally, a liquid crystal display (LCD) has an active matrix driving system using thin film transistors (TFT's) as switching devices to display a naturally moving picture without blur. Such a LCD, thinner in size than the existent cathode ray tube displays, has been widely used as a monitor for a personal computer or a notebook computer, as well as, office automation equipment, such as a copy machine, etc., and portable equipment, such as a cellular phone, pager, etc.

A method of fabricating such an active matrix LCD is comprised of substrate cleaning, substrate patterning, aligning film formation, substrate adhesion/liquid crystal injection, packaging and testing processes.

In the process of substrate cleaning, a cleaner removes foreign substances from the substrates before and after patterning of the upper and lower substrates of the LCD.

The substrate patterning process is divided into a step of patterning the upper substrate and a step of patterning the lower substrate. The upper substrate is provided with color filters, a common electrode and a black matrix. The lower substrate is provided with signal wires, such as data lines and gate lines. A thin film transistor (TFT) is arranged at an intersection between the data lines and the gate lines for each pixel area. A pixel electrode is formed at each pixel area between the data lines and the gate lines. A data line is connected to a source electrode of the TFT in each pixel area.

In the substrate adhesion/liquid crystal injection process, a step of coating an aligning film on the lower substrate and rubbing it is sequentially followed by a step of adhering the upper substrate to the lower substrate, a liquid crystal injection step and an injection hole sealing step. Thereafter, a polarizer is attached to each side of the upper and lower substrates to complete a liquid crystal display panel. Subsequently, a final inspection process on the completed liquid crystal display panel is carried out.

The final inspection process includes a pixel cell defect inspection in which a test pattern is displayed on a screen of the completed liquid crystal display panel to detect the presence or absence of a bad pixel, and an eye inspection for viewing other defects, such as a stain, foreign material or a scratch, etc. During the pixel cell defect inspection, a light is irradiated onto an active array of the LCD panel. While the panel is irradiated with a light, a voltage is applied to a pixel of the LCD to inspect for electrical defects in the completed LCD panel.

FIG. 1 is a perspective view showing a structure of a conventional inspection apparatus for a liquid crystal display device for inspecting a pixel cell defect of a completed LCD panel.

Referring to FIG. 1, an inspection apparatus 100 for a liquid crystal display device includes a chuck 2 loaded with a glass substrate (not shown), a probe frame 110 for applying a pattern signal to LCD panels (not shown) on the glass substrate, and an electro-optic modulator 90 for irradiating a light onto LCD panels (not shown) on the glass.

The glass substrate is safely loaded on the chuck 2 with the aid of a robot arm (not shown). The glass is provided with four LCD panels (not shown) each having the same resolution of pixel cells and a shorting bar (not shown) located at one side of each LCD panel to receive a pattern signal from the exterior for the purpose of inspecting pixel cell defects. A LCD panel is cut from the shorting bar by means of a cutter after the pixel cell defect inspection is done.

FIG. 2 is a plan view showing a structure of a conventional probe frame 110 that is capable of inspecting a single glass substrate 4 on which four LCD panels 5 are provided.

Referring to FIG. 2, the probe frame 110 includes a probe frame body 6, a multiplex board 8 formed integrally at one side of the probe frame body 6, and four probe frame contact pins 24 provided at the inner side of the probe frame body 6 to be connected in correspondence with shorting bars (not shown) of the LCD panels 5.

The probe frame body 6 is formed of a black jig in which an oxide film is grown on an aluminum (Al) film. The probe frame body 6 further includes four vacuum pads 22 installed at the corners thereof such that they allow the probe frame 110 to be drawn to or released from the chuck 2 with a varying state of vacuum. These vacuum pads 22 cause the probe frame 110 to descend onto the chuck 2. The vacuum pads 22 release and raise the probe frame 110 from the chuck 2 when the glass substrate 4 is to be unloaded. The multiplex board 8 frequency divides a pattern signal supplied to the corresponding panel for defect inspection of a pixel cell.

Referring to FIG. 3, the multiplex board 8 includes a multiplex driver integrated circuit (IC) 12 for frequency-dividing an applied signal into five pattern signals, a pogo pin set 14 for supplying a signal to the multiplex driver 12, a relay driver IC for relaying the frequency-divided pattern signal to twelve channels, and a contact pin connector 16 for applying an output signal of the relay driver to a corresponding LCD panel 5.

The pogo pin set 14 receives a signal generated from a pattern modulator (not shown) and delivers it to the multiplex driver IC 12.

Referring to FIG. 4, the pogo pin set consists of a driving pin 10 and a sensing pin 11 for each signal.

A driving pin 10 delivers a signal from the exterior to the multiplex board 8. The sensing pin 11 is responsible for detecting whether or not the respective driving pin 10 has been inserted into a pogo pin contact 30 and electrically connected thereto. The pogo pin contact 30 is arranged at the upper surface of the chuck 2 for the pogo pins 14 to insert into. The pogo pin contacts 30 are in the shape of a hole, and consist of a driving hole 31 and a sensing hole 32 for each signal.

Each of the driving holes 31 is connected to an external pattern modulator. Each of the driving pins 10 of the pogo pin set 14 are inserted into a driving holes 31. In order to correct a contact error when the pogo pin set 14 is connected to the pogo pin contact 30, the probe frame body 6 is provided with an adjust nut/hole (not shown). The adjust nut allows a user to directly adjust the position of a sensing pin 11 until a detection signal from the sensing hole 32 is generated, thereby enabling complete electrical connection of the pogo pin set 14 to the pogo pin contact 30.

The multiplex driver IC 12 frequency-divides a signal applied from the pogo pin set 14 into five pattern signals D1, D2, D3, G1 and G2 and a ground signal GND and applies the same to the relay driver IC. The relay driver IC relays a signal applied from the multiplex driver 12 and converts the relayed signal into 12 channels CH4 to CH15 of the pattern signals D1, D2, D3, G1 and G2, and the ground signal GND.

The pattern signal output from the multiplex board 8 uses a '2G2D' mode or a '2G3D' mode. Herein, the '2G2D' mode is a case of using the second gate signal G2, the first gate signal G1, the second data signal D2 and the first data signal D1 as pattern signals of the gate signal and the data signal while the '2G3D' mode is a case of using the first gate signal G1, the second gate signal G2, the first data signal D1, the second data signal D2 and the third data signal D3.

The contact pin connector 16 is connected to the 12 channels of the relay driver IC to deliver the pattern signal and the ground signal into each of the four probe frame contact pins 24.

Referring to FIG. 5, each of the four probe frame contact pins 24 has a first gate terminal G1, a second gate terminal G2, a first data terminal D1, a second data terminal D2, a third data terminal D3 and a common terminal Vcom.

Each terminal of the probe frame contact pin 24 is connected to a channel of the multiplex board 8 to deliver the pattern signals D1, D2, D3, G1 and G2 and the ground signal GND into the shorting bar of the LCD panel 5. The pattern signals D1, D2, D3, G1 and G2 are applied to the respective terminals of the four probe frame contact pins 24 while the ground signal GND is applied to the common terminal Vcom of the four probe frame contact pins 24. Thus, the four LCD panels 5 formed on a single glass 4 receive the pattern signals D1, D2, D3, G1 and G2 and the ground signal GND via a shorting bar and the contact pin connector 16.

FIG. 6 is a perspective view representing a position relationship of a conventional probe frame to the glass substrate 4 for pixel cell inspection.

In FIG. 6, the glass substrate is safely loaded on the chuck 2. At this time, the pogo pin set 14 of the multiplex board 8 is inserted into and electrically connected to the pogo pin contact 30 provided at the upper surface of the chuck 2, and the probe frame is lowered on to the chuck 2. Then, the four probe frame contact pins 24 provided at the inside of the probe frame 110 come in contact with the shorting bar provided at each LCD panel 5. Thereafter, the pattern signals D1, D2, D3, G1 and G2 and the ground signal GND are applied from the multiplex board 8. Subsequently, an electro-optical modulator 90 shown in FIG. 1 emits a light after being moved toward the probe frame 110 to be close to the glass substrate 4, thereby carrying out a pixel cell defect inspection of the LCD panels 5.

Accordingly, it can be seen that, if a pixel cell radiates a normal color light by the emitted light, the pixel cell is a good pixel cell; otherwise, the pixel cell is a bad pixel. Such a conventional probe frame 110 is capable of providing a pixel cell defect inspection only on at most four LCD panels patterned on the glass substrate 4. In order to improve this situation, a probe frame capable of providing a pixel cell defect inspection when six LCD panels are patterned on a single glass substrate 4 has been suggested.

FIG. 7 is a plan view of a conventional probe frame 120 capable of inspecting a glass substrate provided with six LCD panels.

Referring to FIG. 7, the probe frame 120 includes a probe frame body 36, a multiplex board 38 formed integrally at one side of the probe frame body 36, and six probe frame contact pins 34 provided at the inner sides of the probe frame body 36 to be connected in correspondence with shorting bars (not shown) of the LCD panels 45.

The probe frame body 36 is formed of a black jig in which an oxide film is grown on aluminum (Al). The probe frame body 36 further includes six vacuum pads 92 installed at the corners of the probe frame body 36 such that they cause the probe frame 120 to be drawn to or released from the chuck 42 (see FIG. 8) with a varying state of vacuum. These vacuum pads 92 cause the probe frame 120 to descend on the chuck 42 when the glass 44 is loaded. They release and raise the probe frame 120 from the chuck 42 when the glass substrate 44 is to be unloaded. The multiplex board 38 frequency divides a pattern signal supplied to a corresponding panel for defect inspection of a pixel cell.

Referring to FIG. 8, the multiplex board 38 includes a multiplex driver integrated circuit (IC) 12 (as shown in FIG. 3) for frequency-dividing an applied signal to five pattern signals, a pogo pin set 43 for supplying a signal to the multiplex driver 12, a relay driver IC (as shown in FIG. 3) for relaying the frequency-divided pattern signal to twelve channels, and a contact pin connector 16 (as shown in FIG. 3) for applying an output signal of the relay driver to a corresponding LCD panel 45.

The pogo pin set 43 receives a signal generated from a pattern modulator (not shown) and delivers it to the multiplex driver IC 12. The pogo pin set 43 consists of a pair of a driving pin 46 and a sensing pin 47 with respect to one signal.

The driving pin 46 delivers a signal from the exterior to the multiplex board 38. The sensing pin 47 is for detecting whether or not the pogo pin set 43 has been inserted into a pogo pin contact 40 and electrically connected. The pogo pin contact 40 is positioned on the upper surface of the chuck 42 for the pogo pin set 43 to insert into. The pogo pin contact 40 has holes that consist of a driving hole 48 and a sensing hole 49 each signal.

A driving hole 48 is connected to an external pattern modulator. A driving pin 46 of the pogo pin set 43 is inserted into the driving hole 48. A sensing pin 47 of the pogo pin set 43 is inserted into the sensing hole 49 to detect whether or not the pogo pin set 43 has been electrically connected to the pogo pin contact 40. In order to correct a contact error when the pogo pin set 43 is connected to the pogo pin contact 40 with proper electrical connection, the probe frame body 36 is provided with an adjust nut/hole (not shown). The adjust nut allows a user to directly adjust the position of the driving pin 46 until a detection signal from the sensing hole 49 is generated, thereby electrically connecting the pogo pin set 43 to the pogo pin contact 40.

The multiplex driver IC 12 frequency-divides a signal applied from the pogo pin set 40 into five pattern signals D1, D2, D3, G1 and G2 and a ground signal GND and applies the same to the relay driver IC. The relay driver IC relays a signal applied from the multiplex driver 12 and converts the relayed signal into the pattern signals D1, D2, D3, G1 and G2 and the ground signal GND into 12 channels CH4 to CH15.

The pattern signal outputted from the multiplex board 38 uses a '2G2D' mode or a '2G3D' mode. Herein, the '2G2D' mode is a case of using the second gate signal G2, the first gate signal G1, the second data signal D2 and the first data signal D1 as pattern signals of the gate signal and the data signal while the '2G3D' mode is a case of using the first gate signal G1, the second gate signal G2, the first data signal D1, the second data signal D2 and the third data signal D3.

The contact pin connector 16 is connected to the 12 channels of the relay driver IC to deliver the pattern signal and the ground signal into each of the six probe frame contact pins 34. Each terminal of the probe frame contact pins 34 is connected to a channel of the multiplex board 38 to deliver the pattern signals D1, D2, D3, G1 and G2 and the ground signal GND into the shorting bar of the LCD panel 45. The pattern signals D1, D2, D3, G1 and G2 are applied to the respective terminals of the six probe frame contact pins 34 while the ground signal GND is applied to the common terminal Vcom of the six probe frame contact pins 34.

The glass 44 patterned with the six LCD panels 45 is safely loaded on the chuck 42. The probe frame 120 is lowered on the chuck 42. At this time, the pogo pin set 43 for the multiplex board 38 is inserted into the pogo pin contact 40 provided on the upper surface of the chuck 42. Also, the six probe frame contact pins 34 provided at the inside of the probe frame 120 come in contact with the shorting bar provided at each LCD panel 45. Thereafter, the pattern signals D1, D2, D3, G1 and G2 and the ground signal GND are applied from the multiplex board 38. Subsequently, an electro-optical modulator 90 shown in FIG. 1 emits a light after being moved toward the glass 44 on the probe frame 120, thereby enabling a pixel cell defect inspection for the LCD panels 45.

Accordingly, it can be seen that, if a pixel cell radiates a normal color light in the emitted light, the pixel cell is a good pixel cell; otherwise, the pixel cell is a bad pixel cell.

However, if the conventional probe frames 110 or 120 having more than six LCD panels 5 or 45 on a glass substrate 4 or 44, the conventional probe frame 110 or 120 fail to inspect the LCD panels in the middle of the glass, as shown by the 'A' portion in FIG. 9. Therefore, the conventional probe frames operate with a fixed number of LCD panels per glass and thus require the probe frame in the chuck to be exchanged upon a change of the tested LCD panel model. Thus, the pogo pin set may be damaged or alignment defects may occur upon an exchange of the probe frame. Furthermore, since the probe frame has a fixed size, a worker is unable to exchange the probe frame when the number of pixel cells exceeds 680×880. Accordingly, a safety accident may occur due to an improper exchange work.

SUMMARY OF THE INVENTION

Accordingly, it is an object of the present invention to provide an inspection apparatus for a liquid crystal display that is capable of inspecting more than six panels on a single glass substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, A probe frame assembly of an inspection apparatus for a liquid crystal display device including at least two separate probe frame bodies provided above an upper surface of a chuck for simultaneously applying test pattern signals to shorting bars provided on one or more liquid crystal display panels.

In another aspect of the present invention, an inspection apparatus for a liquid crystal display device, includes a chuck loaded with one or more liquid crystal display panels, a multiplex board attached to one side of the chuck for frequency-dividing test pattern signals, and a probe frame assembly including at least two separate probe frame bodies being provided above an upper surface of the chuck for simultaneously applying the test pattern signals to a shorting bar provided on each of the one or more liquid crystal display panels.

In another aspect of the present invention, an inspection apparatus for a liquid crystal display device includes a chuck loaded with one or more liquid crystal display panels, a multiplex board attached to a side of the chuck to frequency-divide test pattern signals, a probe frame assembly including at least two separate probe frame bodies being provided above an upper surface of the chuck for simultaneously applying the test pattern signals to a shorting bar provided on each one of the one or more liquid crystal display panels, an electro-optical modulator for irradiating a light onto the one or more liquid crystal display panels, and a base member for supporting the chuck, the probe frame assembly and the electro-optical modulator.

In another aspect of the present invention, a method of testing a liquid crystal display panel using a probe frame assembly includes loading a glass substrate patterned with one or more LCD panels onto a chuck, lowering two or more probe frame bodies on the chuck, and simultaneously applying test pattern signals to all of the one or more LCD panels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 10:
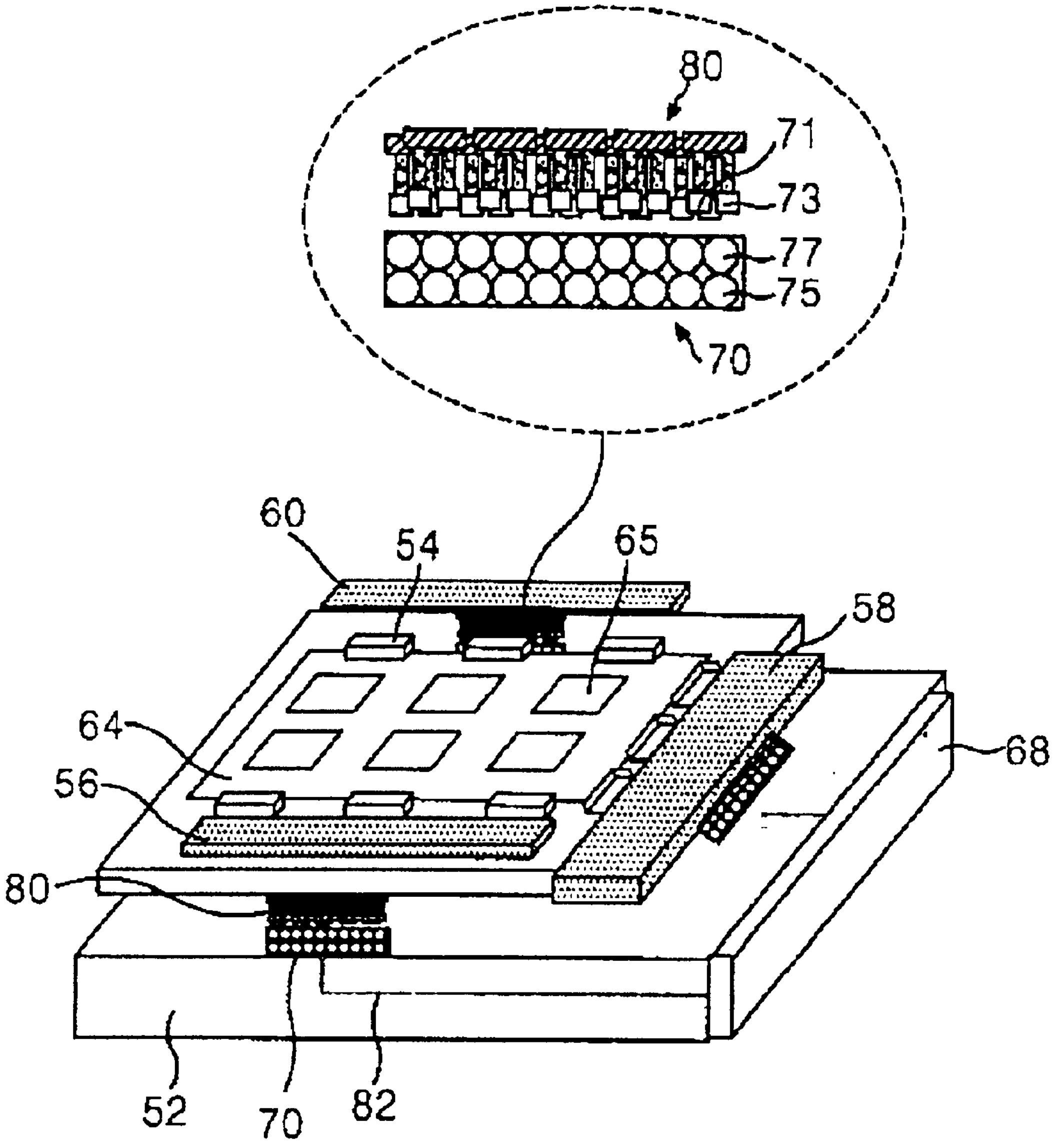
FIG. 10 is a perspective view representing a positional relationship of a probe frame according to an embodiment of the present invention and a chuck.

FIG. 10 is a perspective view representing a positional relationship of a probe frame to a glass patterned with LCD panels for a pixel cell inspection according to an embodiment of the present invention.

Referring to FIG. 10, the pixel cell inspection apparatus according to an embodiment of the present invention includes a chuck 52 loaded with a glass substrate 64, a multiplex board 68 attached to one side of the chuck 52 to generate a test pattern signal, and probe frames 56, 58 and 60 for delivering the test pattern signal to shorting bars are provided on the glass 64.

The glass substrate 64 is safely loaded onto the chuck 52 with the aid of a robot arm (not shown). The glass 64 is provided with nine LCD panels 65 having the same resolution of pixel cells and shorting bars (not shown) located at one side of each LCD panel to receive a pattern signal from the exterior for the purpose of inspecting pixel cell defects. The shorting bars of the LCD panels 65 are cut by means of a cutter after the pixel cell defect inspection is complete. Pogo pin contact 70 having contact holes are provided on the upper surface of the chuck 52 to relay a signal applied from an external mutiplexer board 68. The multiplex board 68 is attached to a side of the chuck 52. The multiplex board 68 frequency-divides a signal applied from a pattern modulator (not shown) into test pattern signals.

Figure 11:
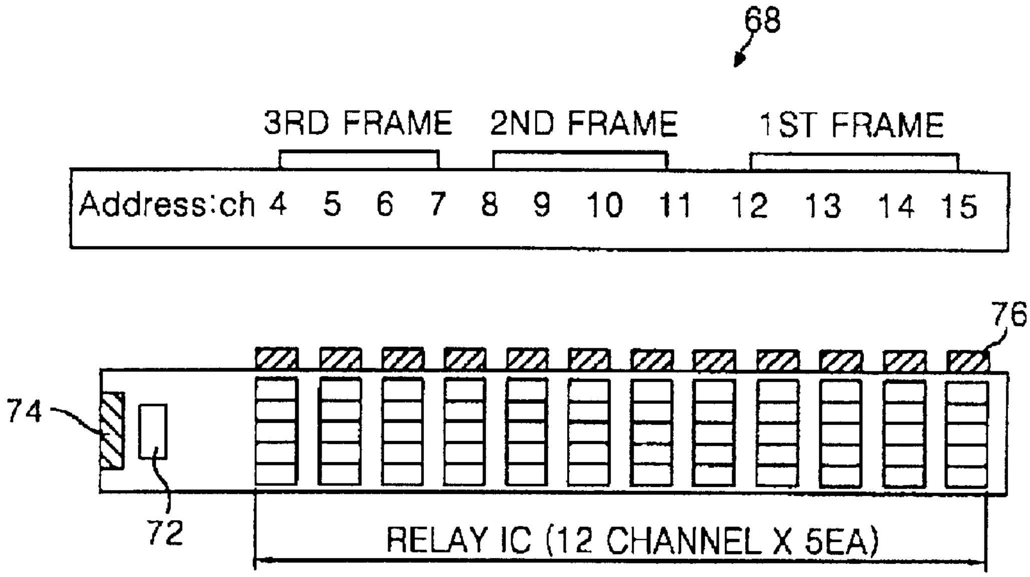
FIG. 11 is a block diagram of the multiplex board shown in FIG. 10.

Referring to FIG. 11, the multiplex board 68 includes a multiplex driver integrated circuit (IC) 72 for frequency-dividing an applied signal of five pattern signals, a pogo pin connector 74 for supplying a signal to the multiplex driver 72, a relay driver IC for relaying the frequency-divided pattern signal into twelve channels, and a contact pin connector 76 for applying an output signal of the relay driver IC to a corresponding LCD panel.

The pogo pin connector 74 receives a signal generated from a pattern modulator (not shown) to deliver it to the multiplex driver IC 72. The multiplex driver IC 72 frequency-divides a signal applied from the pogo pin connector 74 of five pattern signals D1, D2, D3, G1 and G2 and a ground signal GND and applies the same to the relay driver IC. The relay driver IC relays a signal applied from the multiplex driver IC 72 having 12 channels CH4 to CH15 of the pattern signals D1, D2, D3, G1 and G2 and the ground signal GND, to thereby output pattern signals to the contact pin connector 76 for each of 12 channels CH4 to CH15. Each contact pin connector 76 of the 12 channels of the relay driver is connected via a cable or a connector 71 to the pogo pin contacts 70 installed on the chuck 52.

Figure 12:
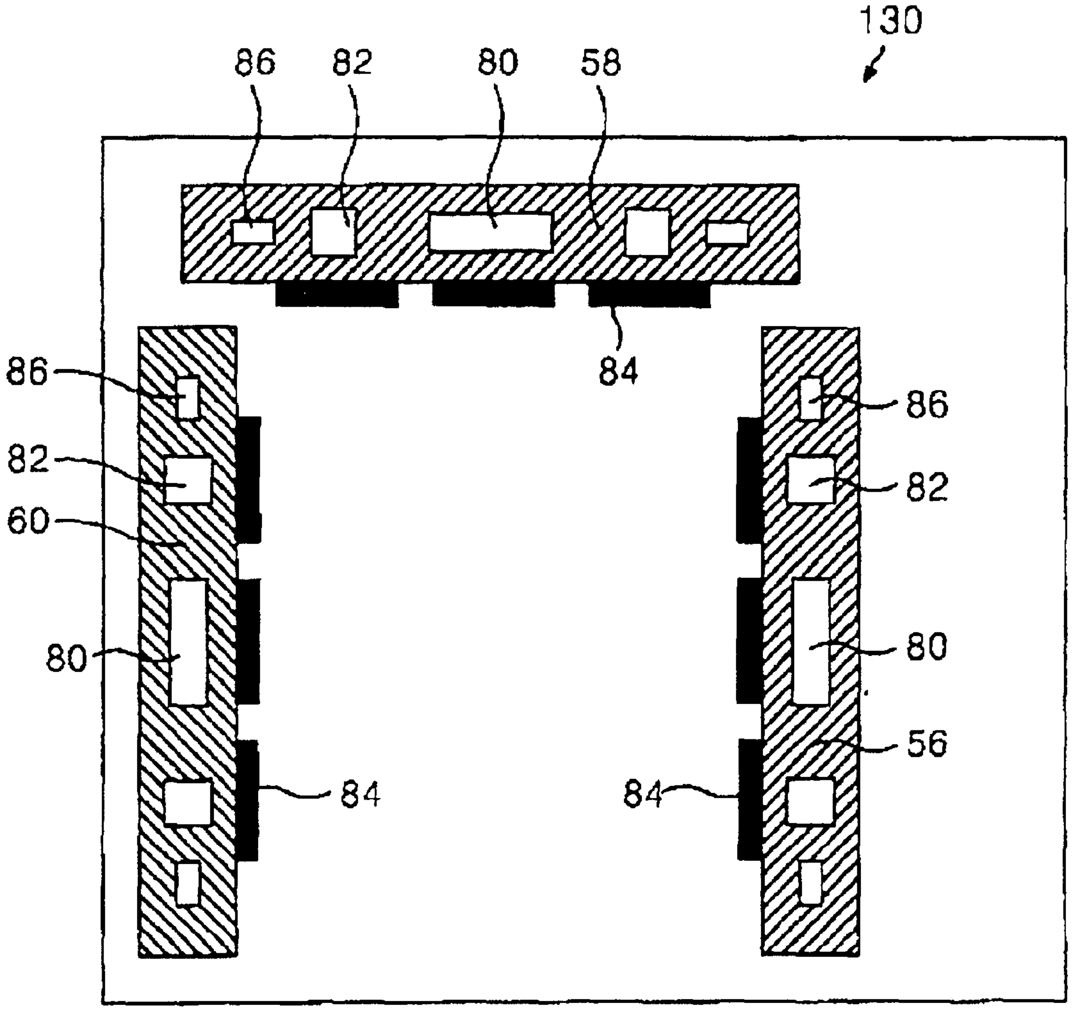
FIG. 12 is a plan view showing a structure of a probe frame assembly having first to third frames according to an embodiment of the present invention.
Figure 13:
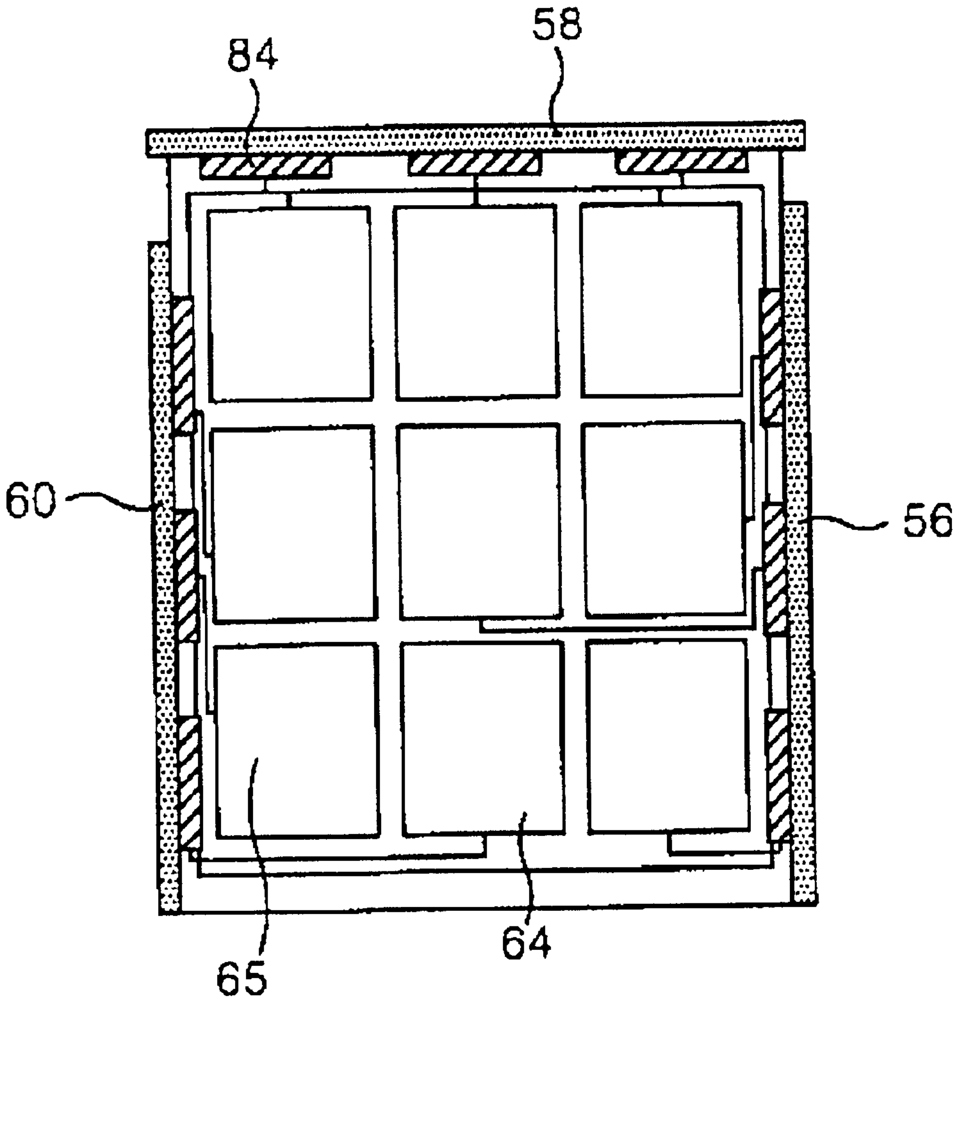
FIG. 13 is a plan view representing a connection relationship of the probe frame according to the embodiment of the present invention to the TFT channel.

FIG. 12 shows a probe frame assembly 130 according to an embodiment of the present invention having first, second and third probe frame bodies 56, 58 and 60.

Referring to FIG. 12, the probe frame assembly 130 includes first to third probe frame bodies 56, 58 and 60, a pogo pin set 80 for receiving test pattern signals of a gate signal and a data signal from the multiplex board 68 (FIG. 10), and probe frame contact pins 84 for delivering the test pattern signals to shorting bars (not shown) of glass the LCD panel.

In the first, second and third probe frame bodies 56, 58 and 60, the first probe frame body 56 is positioned on the opposite side of the second probe frame body 60, and the third probe frame body 58 is positioned perpendicular to the first and second probe frame bodies 56 and 60. Each of the first to third probe frame bodies 56, 58 and 60 is formed of a black jig on which an oxide film is grown on a aluminum (Al). Each of the probe frame bodies 56, 58 and 60 further includes vacuum pads 82 such that the vacuum pads 82 cause the probe frame bodies 56, 58 and 60 to be drawn to or released from the chuck 52 depending on the varying state of vacuum. These vacuum pads 82 of the first to third probe frame bodies 56, 58 and 60 cause the probe frame bodies 56, 58 and 60 to descend onto the chuck 52 when the glass substrate 64 is loaded. They release and raise the first to third probe frame bodies 56, 58 and 60 from the chuck 52 when the glass substrate 64 is to be unloaded The pogo pin sets 80 are inserted into the pogo pin contacts 70 provided on the chuck 52, as shown in FIG. 10, to receive test pattern signals from the multiplex board 68, thereby delivering the test pattern signals into the probe frame contact pins 84. The pogo pin sets 80 consists of a pair of a driving pin 71 and a sensing pin 73 for each signal.

The driving pin 71 delivers a signal from the multiplex board 68. The sensing pin 73 is responsible for detecting whether or not the pogo pin set 80 has been inserted into a pogo pin connectors to make a proper electrical connection. The pogo pin contacts 70 are arranged at positions on the upper portion of the chuck 52 for the pogo pinsets to drop into. The pogo pin contacts 70 have a driving hole 75 and a sensing hole 77 for each signal.

The driving hole 75 is connected to the multiplexer board 68. The driving pin 71 of the pogo pin set 80 inserts into the driving hole 75. The sensing pin 73 of the pogo pin set 80 inserts into the sensing hole 77 to detect whether or not the pogo pin sets 80 have been electrically connected to the pogo pin contacts 70. In order to control a contact error when a pogo pin set 80 is not electrically connected to a pogo pin contact 70, each of the first to third probe frame bodies 56, 58 and 60 are provided with an adjust nut/hole 86. The adjust nut 86 allows a user to directly adjust the position of the pogo pin sets 80 until a detection signal from the sensing hole 77 is generated, thereby assuring electrical connection of the pogo pin sets 80 to the pogo pin contacts 70.

As shown in FIG. 11, the first probe frame body 56 receives the test pattern signals from channels CH12 to CH15 of 12 channels of the contact pin connector 76 while the second probe frame body 58 receives the test pattern signals from channels CH8 to CH11. Further, the third probe frame body 60 receives the test pattern signals from the channels CH4 to CH7. As shown in FIG. 12, the probe frame contact pins 84 apply the test pattern signals delivered via the pogo pin sets 80 to the shorting bars of the LCD panel 65. To this end, three probe frame contact pins 84 are installed on the inside of each of the first to third probe frame bodies 56, 58 and 60.

In the inspection apparatus for the liquid crystal display device according to the present invention, when a glass substrate 64 patterned with nine LCD panels 65 is safely loaded onto the chuck 52, the first to third probe frame bodies 56, 58 and 60 are lowered on the chuck 52. A shorting bar provided for each of the nine LCD panels 65 is electrically connected to the respective probe frame contact pins 84 of the first to third probe frame bodies 56, 58 and 60. Then, the pogo pin sets 80 provided at the first to third probe frame bodies 56, 58 and 60 are inserted into the pogo pin contacts 70 provided on the chuck 52. Therefore, the test pattern signals from the multiplex board 68 are applied to the shorting bars of the LCD panels 65.

The test pattern signals from the multiplex board 68 using a '2G2D' mode or a '2G3D' mode are applied, via three probe frame contact pins 84, to the respective shorting bars of the LCD panels 65. The '2G2D' mode is a case of using the second gate signal G2, the first gate signal G1, the second data signal D2 and the first data signal D1 as pattern signals of the gate signal and the data signal while the '2G3D' mode is a case of using the first gate signal G1, the second gate signal G2, the first data signal D1, the second data signal D2 and the third data signal D3.

Figure 1:
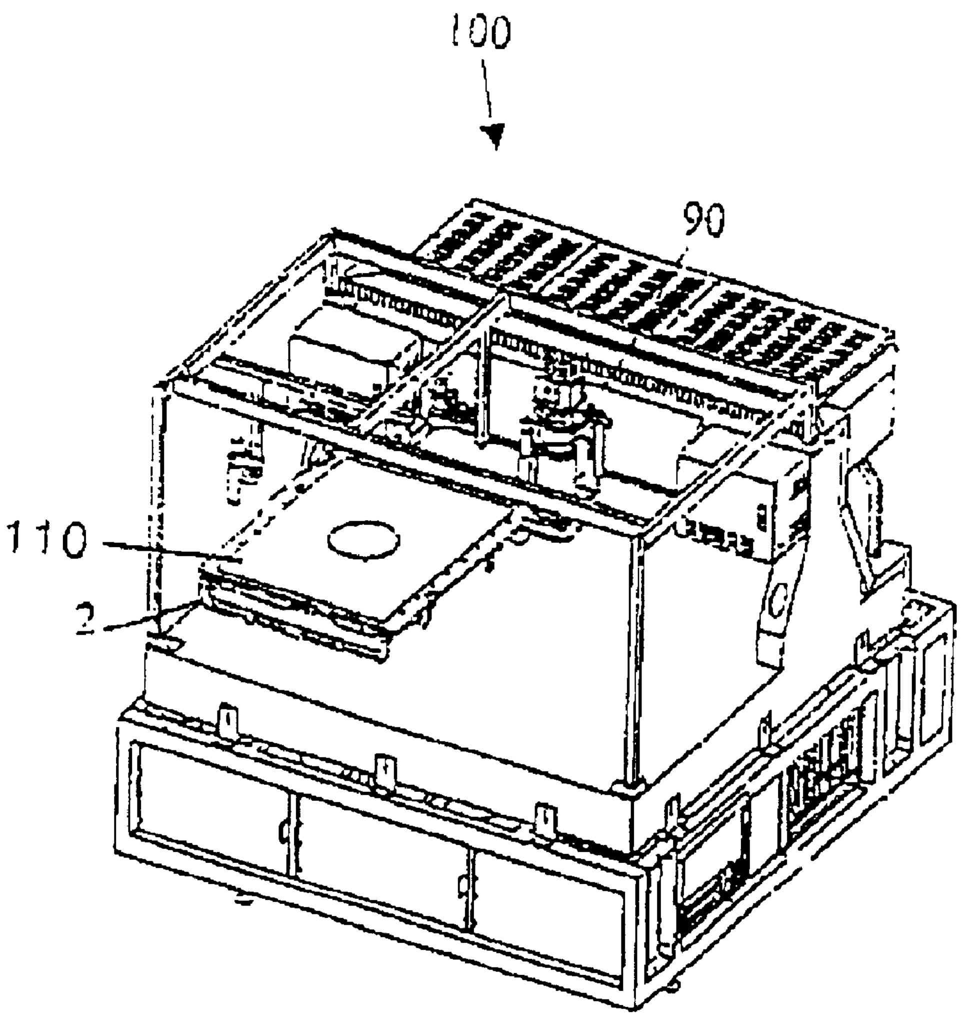
FIG. 1 CONVENTIONAL ART
FIG. 1 is a perspective view showing a structure of a conventional inspection apparatus for a liquid crystal display device for inspecting pixel cell defects of a completed LCD panel.
Figure 2:
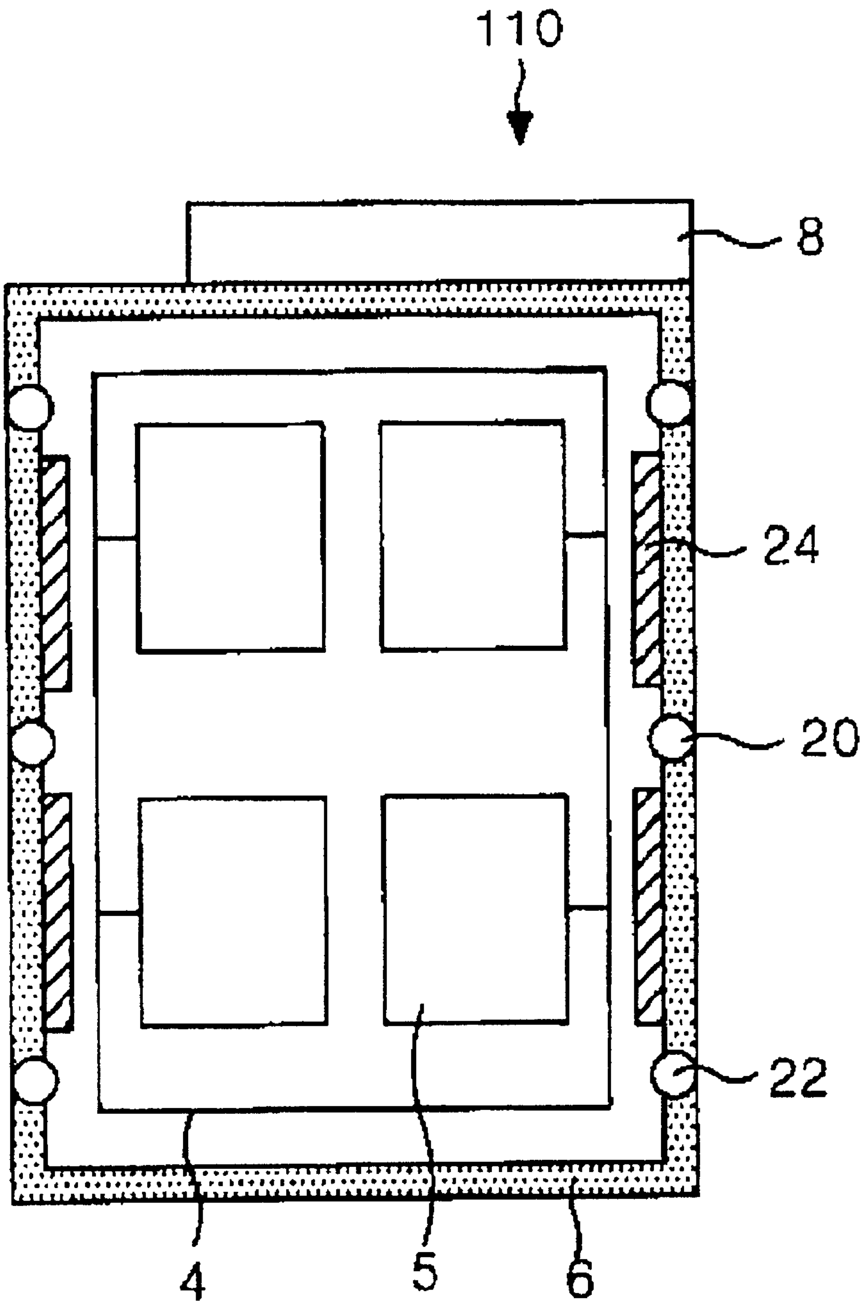
FIG. 2 CONVENTIONAL ART
FIG. 2 is a plan view showing a structure of a conventional probe frame.
Figure 3:
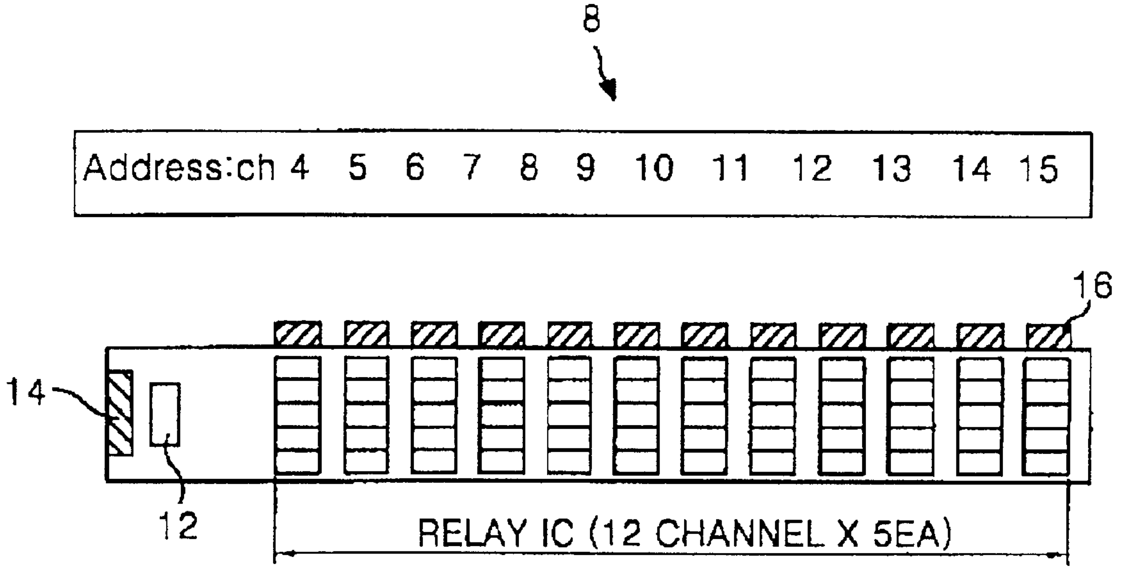
FIG.3 CONVENTIONAL ART
FIG. 3 is a block diagram of the multiplex board shown in FIG. 2.
Figure 4:
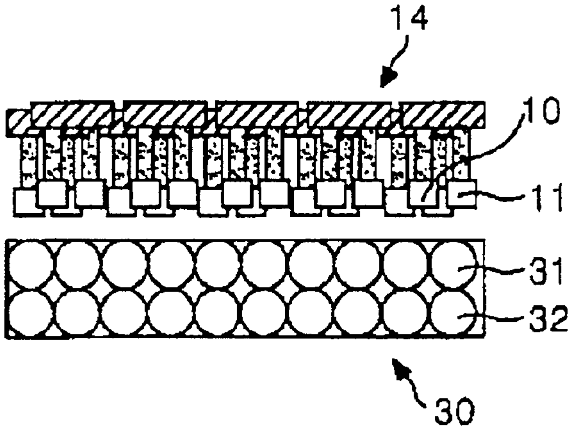
FIG.4 CONVENTIONAL ART
FIG. 4 is a section view of the pogo pin contact and the pogo pin set shown in FIG. 2 and FIG. 3.
Figure 5:
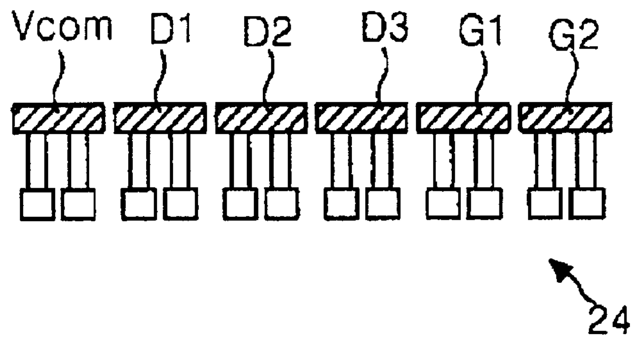
FIG. 5 CONVENTIONAL ART
FIG. 5 is a cross section view of the probe frame contact pins shown in FIG. 2.
Figure 6:
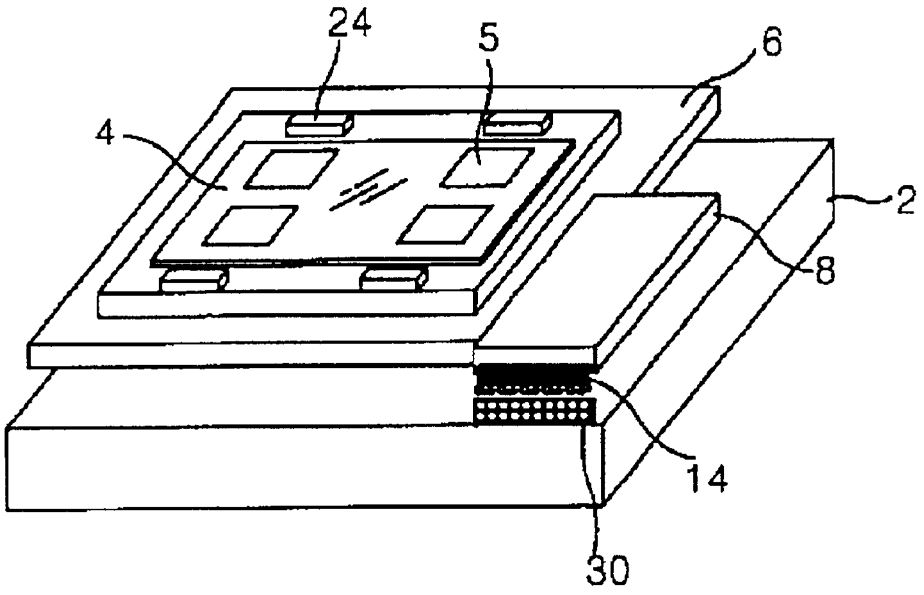
FIG. 6 CONVENTIONAL ART
FIG. 6 is a perspective view representing a positional relationship of the conventional probe frame shown in FIG. 2 to the chuck.
Figure 7:
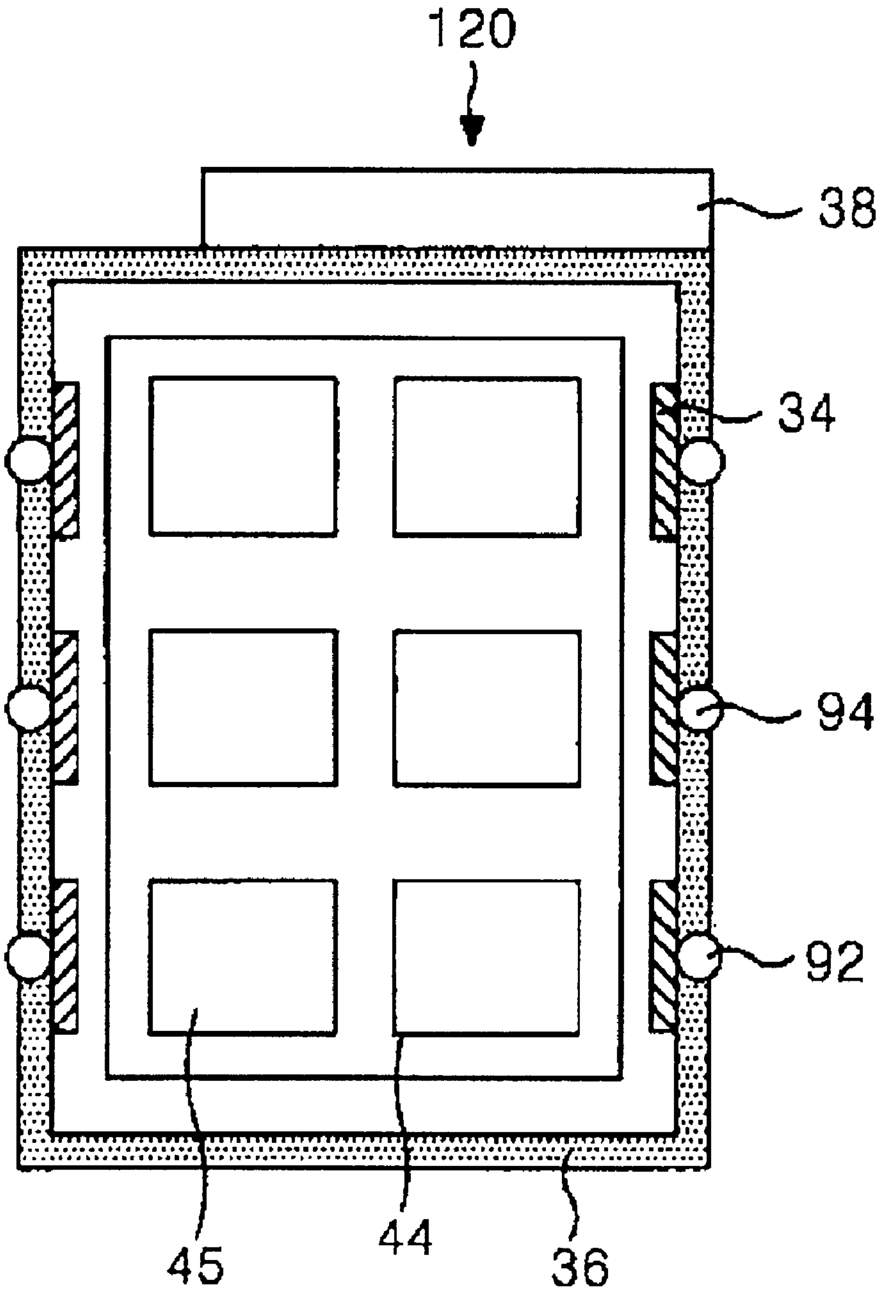
FIG.7 CONVENTIONAL ART
FIG. 7 is a plan view of another conventional probe frame.
Figure 8:
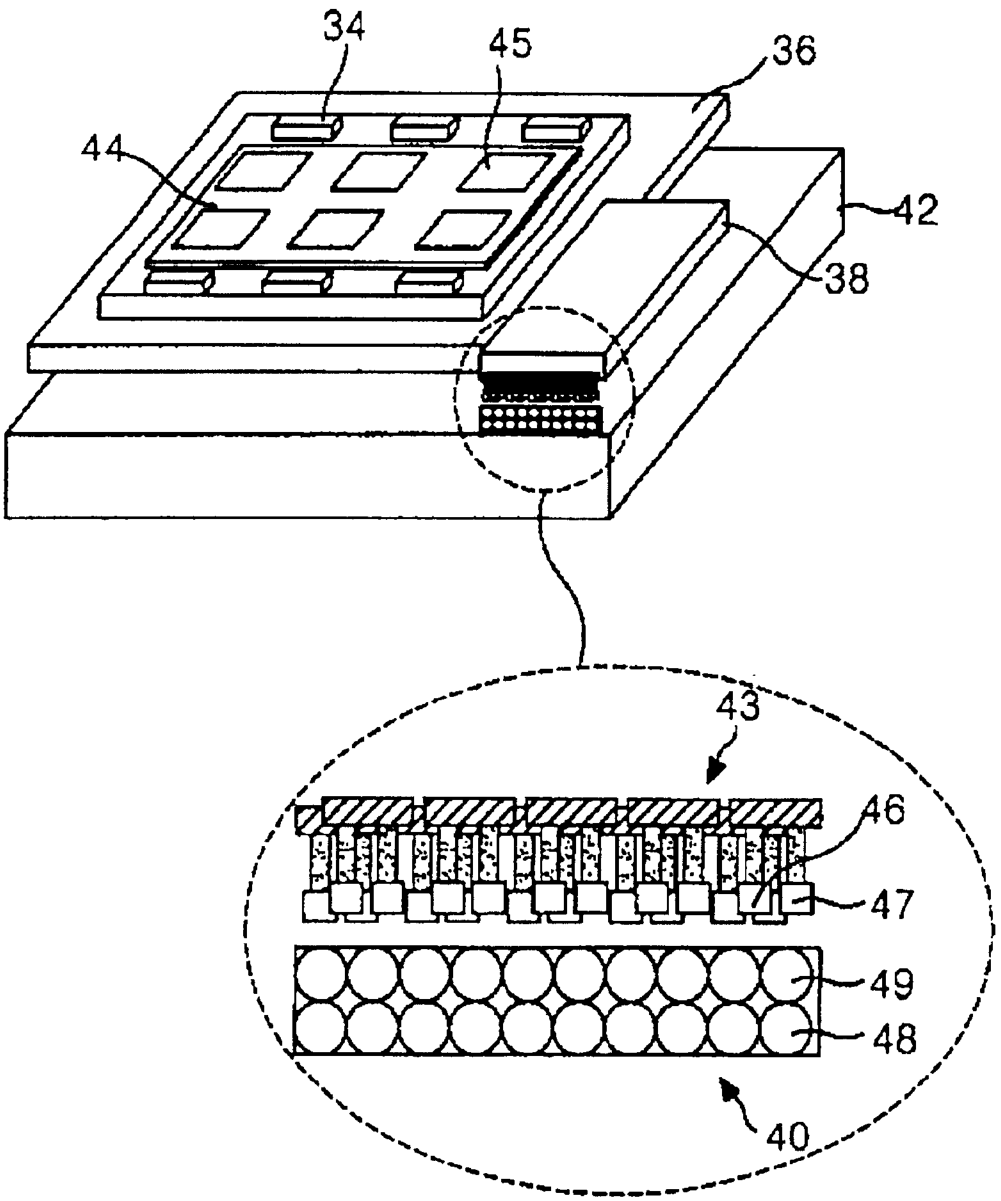
FIG.8 CONVENTIONAL ART
FIG. 8 is a perspective view representing a position relationship of the conventional probe frame shown in FIG. 7 to the chuck.
Figure 9:
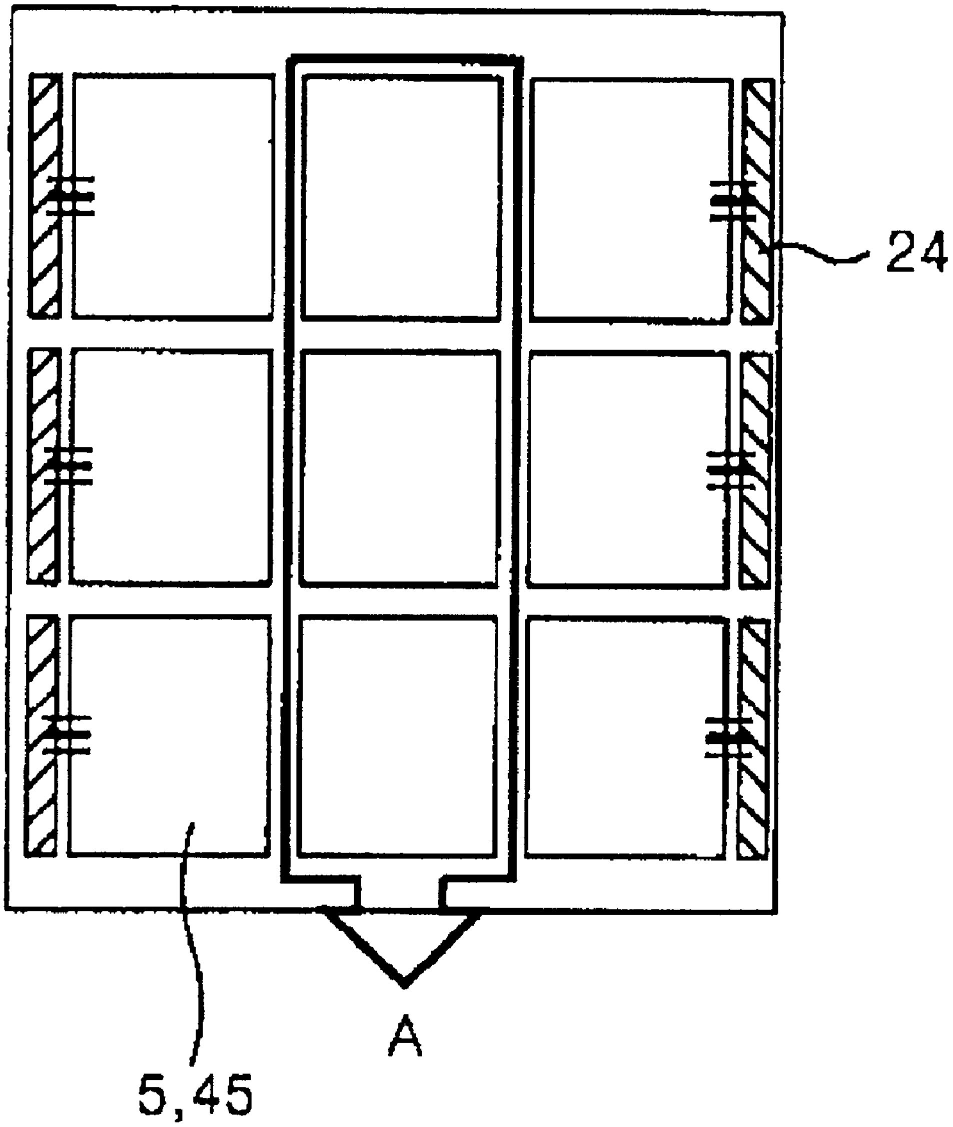
FIG.9 CONVENTIONAL ART
FIG. 9 is a plan view for explaining a problem in the conventional probe frames.

If the test pattern signals are applied to the shorting bars of the LCD panels 65, then an electro-optical modulator 90 shown in FIG. 1 emits a light after being moved close to the glass substrate 64 so that the pixel cell defect inspection of the patterned LCD panels 65 can be carried out.

Accordingly, it can be seen that, if a pixel cell radiates a normal color light in the emitted light, the pixel cell is a good pixel cell; otherwise, the pixel cell is a bad pixel cell.

When up to two LCD panels 65 have been patterned on a single glass substrate 64, they receive the test pattern signals from the channels CH12 to CH15 of the 12 channels of the multiplex board 68 only with the aid of the first probe frame body 56. When four to six LCD panels 65 have been patterned on a glass substrate 64, they receive the test pattern signals from the channels CH8 to CH15 of the 12 channels of the multiplex board 68 with the aid of the first and second probe frame bodies 56 and 58. Similarly, when six to nine LCD panels 65 have been patterned on a glass 64, they receives the test pattern signals from the channels CH4 to CH15 of the 12 channels of the multiplex board 68 with the aid of all of the first to third probe frame bodies 56, 58 and 60.

Furthermore, when more than nine LCD channels 65 are patterned on a glass substrate 64, a fourth probe frame body (not shown) prepared separately is provided at the probe frame 130 on the chuck 52 to apply the test pattern signals from all of the channels of the multiplex board 68 to the LCD panels, thereby enabling pixel cell defect inspection work to be carried out.

In the present inspection apparatus for a liquid crystal display device, the separate-type probe frame 130 including first to third probe frame bodies 56, 58 and 60 is provided, and the multiplex board 68 is attached to a side of the chuck 52, so that the first to third probe frame bodies 56, 58 and 60 can be selectively used depending on the number of LCD panels 65 patterned on the glass substrate 64. Accordingly, it becomes possible to maximize the utility of the multiplex board 68 as well as to cope with at an instance of a relay driver failure by utilizing an extra channel. In addition, the separate-type probe frame is used, so that it can be easily changed by one worker upon a change in the tested LCD model even when the number of pixel cells exceeds 680×880.

As described above, according to the present invention, the probe frame assembly is made of separate probe frame bodies, so that it is possible to carry out an inspection even when more than six LCD panels are patterned on a glass substrate. Furthermore, a probe frame of the present invention can be easily changed by one worker. Moreover, the time required for model changeovers can be shortened to improve manufacturing efficiency because the separate-type probe frame can accommodate a range of numbers of liquid crystal display panels.

It will be apparent to those skilled in the art that various modifications and variations can be made in the LCD panel of the present invention without departing from the spirit or scope of the invention. Thus, it is intended that the present invention cover the modifications and variations of this invention provided they come within the scope of the appended clams and their equivalents.

What is claimed is:

1. A probe frame assembly of an inspection apparatus for a liquid crystal display device, comprising:

at least two separate probe frame bodies provided above an upper surface of a chuck for simultaneously applying test pattern signals to shorting bars provided on one or more liquid crystal display panels.

2. The probe frame assembly according to claim 1, wherein each of the probe frame bodies includes:

probe frame contact pins being in contact with the shorting bars;

a pogo pin set for insertion into a pogo pin contact provided on the chuck for delivering the test pattern signals to the probe frame contact pins;

a vacuum pad that is drawn to the chuck when a vacuum is applied; and an alignment-adjusting member for positioning the pogo pin set to align with the pogo pin contact.

3. A method of testing a liquid crystal display panel using the probe assembly according to claim 1, the method including:

simultaneously applying the test pattern signals to the shorting bars of the one or more liquid crystal display panels.

4. An inspection apparatus for a liquid crystal display device, comprising:

a chuck loaded with one or more liquid crystal display panels;

a multiplex board attached to one side of the chuck for frequency-dividing test pattern signals; and a probe frame assembly including at least two separate probe frame bodies being provided above an upper surface of the chuck for simultaneously applying the test pattern signals to a shorting bar provided on each of the one or more liquid crystal display panels.

5. The inspection apparatus according to claim 4, wherein the probe frame assembly has at least three separate probe frame bodies that simultaneously apply test patterns to at least six liquid crystal display panels.

6. The inspection apparatus according to claim 4, wherein the chuck includes a pogo pin contact including a plurality of contact holes.

7. The inspection apparatus according to claim 6, further comprising:

a cable and a connector for electrically connecting the pogo pin contact to the multiplex board.

8. The inspection apparatus according to claim 7, wherein the cable and the connector are provided on a side of the chuck.

9. The inspection apparatus according to claim 4, wherein each of the probe frame bodies includes:

probe frame contact pins in contact with the shorting bars;

a pogo pin set capable of being inserted into a pogo pin contact provided on the chuck for delivering test pattern signals to the probe frame contact pins;

a vacuum pad that is drawn to the chuck when a vacuum is applied; and an alignment-adjusting member for positioning the pogo pin set to align with a pogo pin contact.

10. A method of testing a liquid crystal display panel using the probe assembly according to claim 4, the method including:

simultaneously applying the test pattern signals to the shorting bars of the one or more liquid crystal display panels.

11. An inspection apparatus for a liquid crystal display device, comprising:

a chuck loaded with one or more liquid crystal display panels;

a multiplex board attached to a side of the chuck to frequency-divide test pattern signals;

a probe frame assembly including at least two separate probe frame bodies being provided above an upper surface of the chuck for simultaneously applying the test pattern signals to a shorting bar provided on each one of the one ore more liquid crystal display panels;

an electro-optical modulator for irradiating a light onto the one or more liquid crystal display panels; and a base member for supporting the chuck, the probe frame assembly and the electro-optical modulator.

12. The inspection apparatus according to claim 11, wherein the probe frame assembly has at least three separate probe frame bodies that simultaneously apply test patterns to at least six liquid crystal display panels.

13. The inspection apparatus according to claim 11, wherein the chuck includes a pogo pin contact each having holes.

14. The inspection apparatus according to claim 13, further comprising:

a cable and a connector for electrically connecting the pogo pin contact to the multiplex board.

15. The inspection apparatus according to claim 14, wherein the cable and the connector are provided at a side of the chuck.

16. The inspection apparatus according to claim 11, wherein each of the probe frame bodies includes:

probe frame contact pins being in contact with a shorting bar;

a pogo pin set capable of being inserted into a pogo pin contact provided on the chuck for delivering test pattern signals to the probe frame contact pins;

a vacuum pad that is drawn to the chuck when a vacuum is applied; and an alignment-adjusting member for positioning the pogo pin set to align with the pogo pin contact.

17. A method of testing a liquid crystal display panel using the probe assembly according to claim 11, the method including:

simultaneously applying the test pattern signals to the shorting bars of the one or more liquid crystal display panels.

18. A method of testing a liquid crystal display panel using a probe frame assembly, the method including:

loading a glass substrate patterned with one or more LCD panels onto a chuck;

lowering two or more probe frame bodies on the chuck; and simultaneously applying test pattern signals to all of the one or more LCD panels.

19. The method of testing a liquid crystal display panel using a probe frame assembly according to claim 18, wherein each of the probe frame bodies includes:

probe frame contact pins being in contact with a shorting bar;

a pogo pin set capable of being inserted into a pogo pin contact provided on the chuck for delivering test pattern signals to the probe frame contact pins;

a vacuum pad that is drawn to the chuck when a vacuum is applied; and an alignment-adjusting member for positioning the pogo pin set to align with the pogo pin contact.

* * * * *